United States Patent

Shah et al.

(10) Patent No.: US 6,925,402 B2
(45) Date of Patent: Aug. 2, 2005

(54) METHOD OF OPERATING A MICROCONTROLLER CHIP HAVING AN INTERNAL RC OSCILLATOR AND MICROCONTROLLER CHIP EMBODYING THE METHOD

(75) Inventors: Hitesh Shah, Noida (IN); Laurent Perier, Saint Zacharie (FR)

(73) Assignees: STMicroelectronics S.A., Montrouge (FR); STMicroelectonics Ltd., Uttar Pradesh (IN)

( * ) Notice: Subject to any disclaimer, the term of this patent is extended or adjusted under 35 U.S.C. 154(b) by 0 days.

(21) Appl. No.: 10/610,343

(22) Filed: Jun. 30, 2003

(65) Prior Publication Data

US 2004/0068383 A1 Apr. 8, 2004

(30) Foreign Application Priority Data

Jul. 5, 2002 (EP) ............................................ 02291700

(51) Int. Cl.$^7$ ............................ H03L 1/00; G01R 35/00
(52) U.S. Cl. .......................... 702/89; 702/107; 327/160
(58) Field of Search .......................... 702/89, 107, 106; 331/111, 143; 345/50, 519; 327/160, 273

(56) References Cited

U.S. PATENT DOCUMENTS 6,326,825 B1    12/2001   Walley
6,339,413 B1 *   1/2002   Drake et al. .................. 345/50
6,653,907 B2 *  11/2003   Kobota ....................... 331/111
2001/0007091 A1  7/2001   Waller et al.

OTHER PUBLICATIONS

European Search Report dated Dec. 18, 2002 for European Application No. 02291700.

* cited by examiner

*Primary Examiner*—Kamini Shah
(74) *Attorney, Agent, or Firm*—Lisa K. Jorgenson; Jose Gutman; Fleit, Kain, Gibbons, Gutman, Bongini & Bianco P.L.

(57) ABSTRACT

A chip includes CPU (12), memories (13,14) for programs and data, peripheral units (18,19) for interacting with the outside world, and an internal RC oscillator (17) for providing clock signals. One of the peripheral units (18) includes a timer counter incremented at a frequency derived from the RC oscillator. The method does not try to change the frequency of the RC oscillator. Instead, an external calibration source (21) is connected to a capture input of the timer unit to provide a signal having a reference frequency, e.g. the mains frequency. The counter is sampled on active edges of that signal, and the sampled values are processed to derive a calibration ratio. After these calibration steps, a software correction is applied to parameters handled by programs stored in memory based on the calibration ratio to compensate for frequency variations of the RC oscillator.

18 Claims, 3 Drawing Sheets

METHOD OF OPERATING A MICROCONTROLLER CHIP HAVING AN INTERNAL RC OSCILLATOR AND MICROCONTROLLER CHIP EMBODYING THE METHOD

CROSS-REFERENCE TO RELATED APPLICATION

This application is based upon and claims priority from prior European Patent Application No. 02 291 700.9, filed on Jul. 5, 2002, the entire disclosure of which is herein incorporated by reference.

BACKGROUND OF THE INVENTION

1. Field of the Invention

The present invention relates to the clocking of microcontroller circuits. It applies to microcontroller chips having an internal RC oscillator to define the operating frequency of the central processing unit.

2. Description of the Related Art

Many computer systems utilize general purpose microcontrollers that are operated with various kinds of clock sources. The cheapest method is to use an internal RC oscillator as a clock source. This method is very interesting for the application developers, particularly for mass usage applications with a relatively low clock frequency, e.g. 2–5 MHz.

However, the frequency delivered by an RC oscillator source is very dependent on the operating conditions, particularly on temperature. The frequency variation range depends on the circuit design and its manufacturing process. It may be up to about ±40%.

The available solutions to adjust the internal RC oscillator are based on the internal chip design. The frequency adjustment is performed by means of a array of resistors and switches forming a digital potentiometer. A calibration value stored in a specific register determines which resistors are to be included in the resistive part of the RC circuit and controls the states of the switches accordingly. The calibration value is determined beforehand by means of an external frequency reference.

Such a solution is satisfactory, but the problem is that it is not always possible or desired to implement it.

It supposes that the microcontroller has specific EEPROM registers capable of storing a calibration value. Such registers are not available in certain technologies, such as in ROM or flash memory microcontrollers.

Even if the technology is compatible with such a solution, it remains that the array used for adjusting the oscillator frequency occupies a significant surface on the chip and thus increases the hardware cost of the product.

Accordingly, there exists a need for overcoming the disadvantages of the prior art as discussed above.

SUMMARY OF THE INVENTION

A significant advantage of an embodimet of the present invention is in realizing a cheap and efficient method for clocking a microcontroller chip from an internal RC oscillator.

An embodiment of the present invention thus proposes a method of operating a microcontroller chip having a CPU, memory means for storing programs and data, at least one peripheral unit for interacting with the outside of the chip, and an internal RC oscillator for providing clock signals to the central processing and peripheral units. The at least one peripheral unit comprises a timer unit having a counter incremented at a frequency proportional to an oscillation frequency of the RC oscillator.

According to the invention, a preferred method comprises the steps of:

connecting an external calibration source to a capture input of the timer unit, the calibration source providing a calibration signal having a predefined reference frequency;

sampling a value of the counter on active edges of the calibration signal;

processing the sampled values of the counter to derive a calibration ratio; and performing software correction of at least one parameter handled by a program stored in the memory means based on the calibration ratio to compensate for frequency variations of the RC oscillator.

The internal RC oscillator of the chip is not forced to oscillate at a specified frequency. The parameter variations due to the manufacturing process, the operating temperature, etc., are tolerated. Their compensation is not made by means of a hardware modification of the oscillator parameters, but by means of the software that runs in the CPU of the microcontroller.

Where a peripheral unit requires a precise timing, the software corrects corresponding parameters based on the evaluated calibration ratio in order to meet the requirement.

A calibration phase is typically used when the apparatus incorporating the microcontroller chip is switched on. Depending on the application and its environment, it may be necessary to update the calibration ratio from time to time when the apparatus remains under voltage.

Another aspect of the invention relates to microcontroller chip comprising:

a CPU;

memory means for storing programs and data at least one peripheral unit for interacting with the outside of the chip, including a timer unit having a counter incremented at a frequency proportional to an oscillation frequency of the RC oscillator;

an internal RC oscillator for providing clock signals to the central processing and peripheral units; and means for sampling a value of the counter on active edges of a calibration signal having a predefined reference frequency, supplied at a capture input of the timer unit by an external calibration source.

The stored programs include instructions for processing the sampled values of the counter to derive a calibration ratio, and instructions for performing software correction of at least one parameter based on the calibration ratio to compensate for frequency variations of the RC oscillator.

BRIEF DESCRIPTION OF THE DRAWING

Other features and advantages of the invention will become apparent in the following description of non-limiting exemplary embodiments, with reference to the accompanying drawings, in which.

DESCRIPTION OF THE PREFERRED EMBODIMENTS

Figure 1:
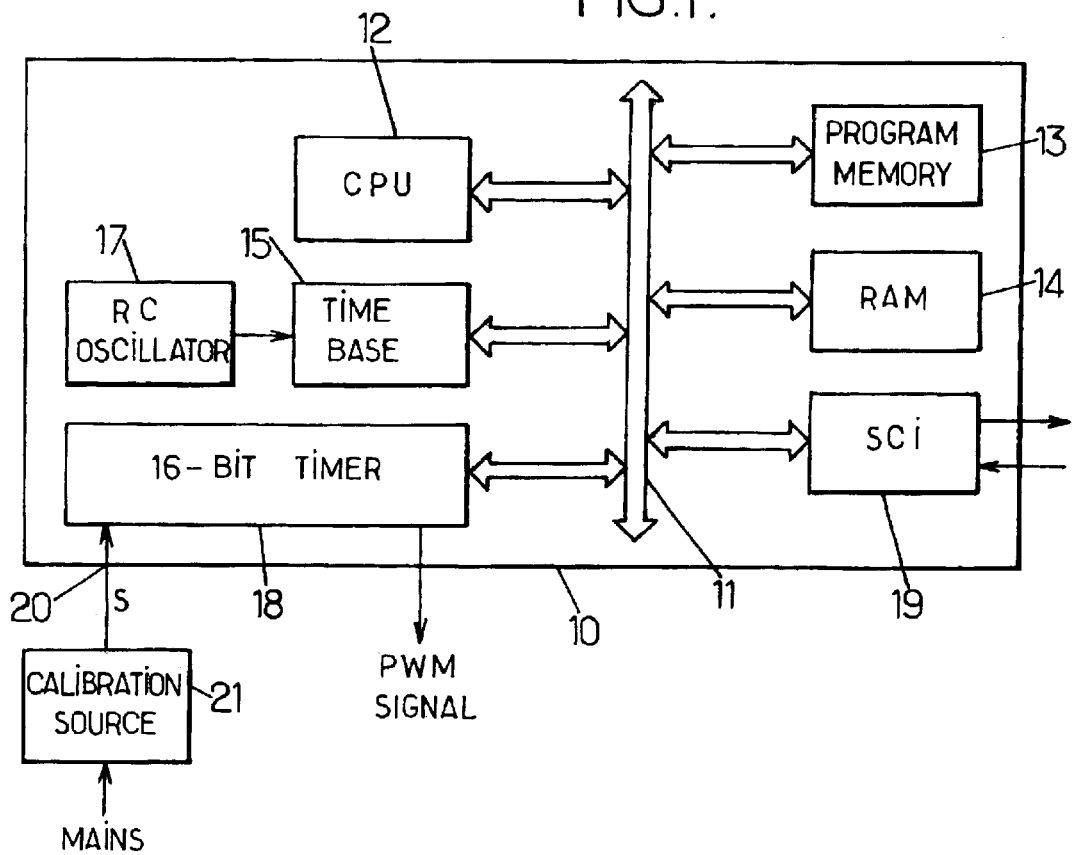
FIG. 1 is a block diagram of a microcontroller chip according to the present invention.

FIG. 1 illustrates the general architecture of a microcontroller circuit 10. The indicated bus 11 is understood to include all the lines (data, address, control, clock, power supply, . . . ) used to distribute the data and signals among the various units of the microcontroller. The CPU 12 is conventionally associated with a program memory 13 and with a random access memory (RAM) 14.

The clock signals used within the microcontroller circuit 10 are provided by a time base 15 which derives them from an internal RC oscillator 17. The oscillation frequency of the RC circuit 17 is not adjusted to match a specific reference value. As an example, a target value for the clock frequency $F_{CPU}$ of the CPU 12 may be $F_{CPU}$=2 MHz (other values are of course possible, as indicated in the product data sheet). However, due to the inevitable variations in the manufacturing process of the chip and to the environment of the circuit, particularly the temperature, the RC oscillator frequency drifts so that $F_{CPU}$ will normally differ from its target value.

It will be appreciated that the time base 15 of the microcontroller may also receive external clock signals from an input pin of the chip. In such a case, the present invention applies to an operating mode in which the basic frequency is provided by the RC oscillator 17.

The microcontroller chip 10 further includes a number of peripheral units that, in the example shown in FIG. 1, consist of a 16-bit timer unit 18 and a serial communication interface (SCI) unit 19. Of course, other kinds of peripheral units could be provided, depending on the product line of the microcontroller.

The 16-bit timer unit 18 includes a free running 16-bit counter incremented at a frequency proportional to the oscillation frequency of the RC oscillator 17. This incrementation frequency may be selected as half of the CPU clock frequency $F_{CPU}$. As indicated in the lower diagram of FIG. 2, the overflow value of the 16-bit counter is for example FFFC in hexadecimal notation.

The 16-bit timer unit 18 has a capture input 20. When an active (falling) edge occurs in a signal supplied at the capture input 20, the timer unit 18 generates an interrupt for the CPU 12 and presents the counter value on the data bus. The interrupt program samples the current counter value and stores it in RAM 14.

In order to calibrate the RC oscillator 17, an external calibration source 21 is connected to the capture input 20 of the 16-bit timer unit 18. Any kind of calibration source providing a reference frequency $F_R$ can be used. It will frequently be convenient to obtain the reference frequency $F_R$ of the calibration source 21 from the A.C. mains. Typical reference frequencies are then $F_R$=50 Hz in Europe and $F_R$=60 Hz in the United States. The calibration source 21 then consists of a simple voltage limiter circuit to convert the mains voltage into a substantially square calibration signal S having a low voltage, e.g. 0–5 V. This limiter circuit may be associated with a band-pass filter to remove high frequency components which may be superimposed on the nominal mains frequency.

Figure 2:
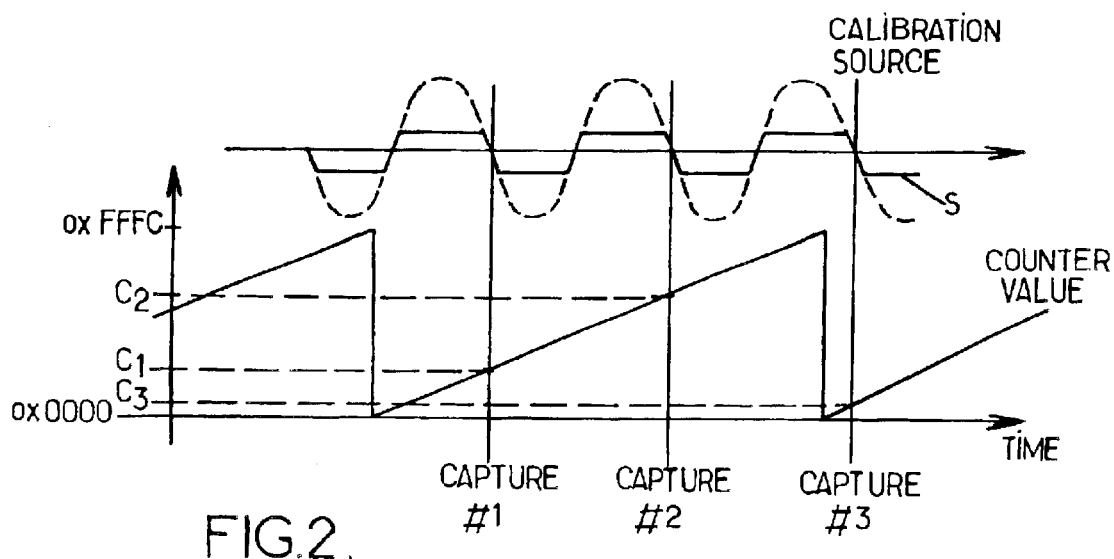
FIG. 2 is a timing diagram illustrating a calibration phase executed in accordance with the invention.

In a calibration phase where the calibration source 21 is activated, each falling edge of the calibration signal S gives rise to the capture of the counter value, as illustrated in FIG. 2.

Figure 3:
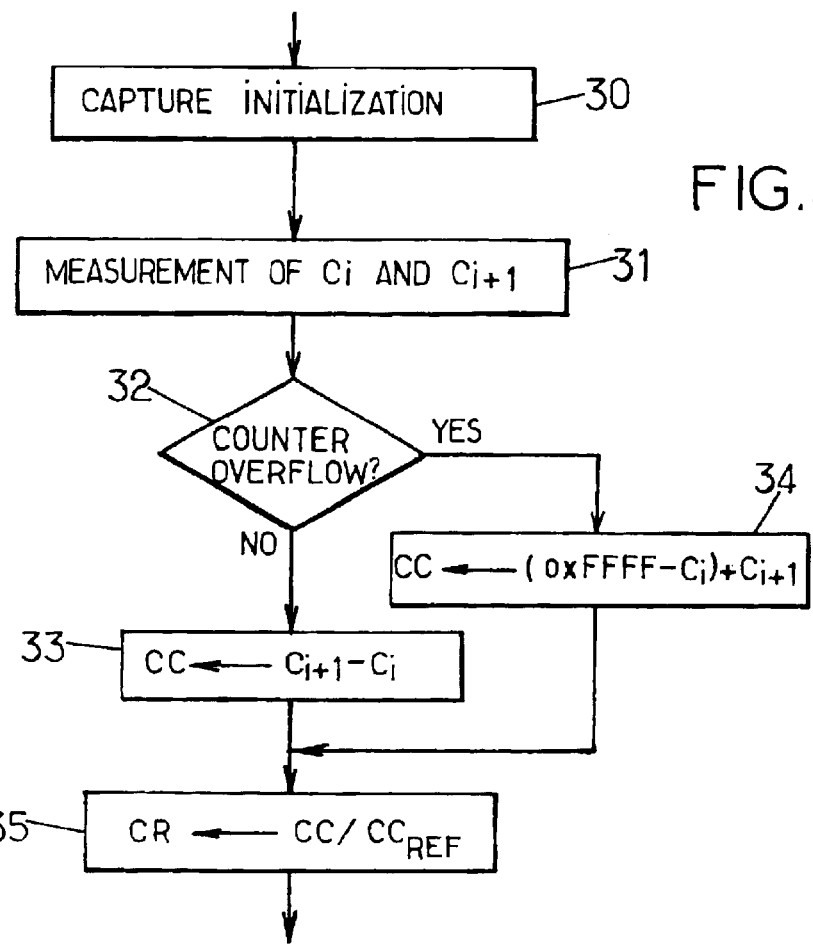
FIGS. 3 and 4 are flow charts of two possible calibration procedures.

FIG. 3 illustrate a possible calibration procedure that may be carried out by means of a short piece of software stored in program memory 14.

The capture process is first initialized in step 30, which includes activation of the calibration source 21. Once two consecutive counter values $c_i$ and $c_{i+1}$ have been sampled (step 31), it is determined whether an overflow of the 16-bit timer has occurred between the two captures (test 32). Indeed, the relevant difference value to be compared with a reference value depending on the reference frequency $F_R$ is dependent on whether one or more counter overflows took place in the meantime. If there has been no intervening overflow (such as between captures #1 and #2 in FIG. 2), the relevant difference value CC is simply $C_{i+1}-C_i$ (step 33). If there has been an overflow (such as between captures #2 and #3 in FIG. 2), the difference value CC is equal to 0xFFFF−$C_i$+$C_{i+1}$ (step 34). The typical frequency range of the RC oscillator is normally such that 0 or 1 overflow occurs between two consecutive captures. If necessary, the formulas of step 33 and 34 are readily adapted to cases where more than one overflow would be possible.

The last step 35 of the calibration procedure shown in FIG. 3 consists in computing the calibration ratio CR by dividing the difference value CC by a pre-calculated reference value $CC_{REF}$. The reference value $CC_{REF}$ is inversely proportional to the reference frequency provided by the mains. For a target $F_{CPU}$ of 2 MHz, divided by two to increment the 16-bit counter, it is $CC_{REF}$=0x4E20 for the European mains (50 Hz), and $CC_{REF}$=0x411B for the US mains (60 Hz).

Once the calibration ratio CR is computed in step 35, it is stored in RAM 14 for subsequent use by the application software to perform correction of one or more timing parameters.

Figure 4:
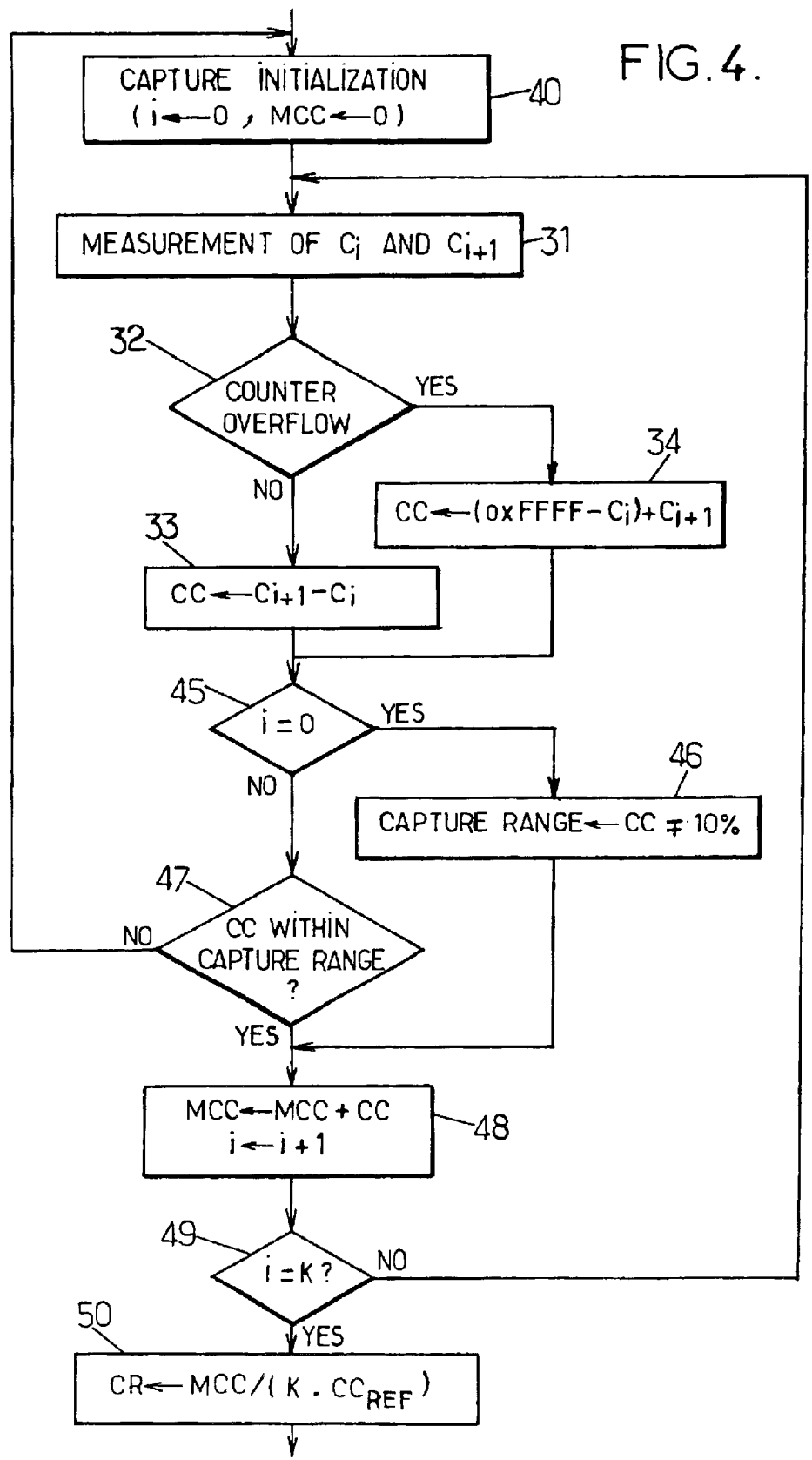

FIG. 4 illustrates an alternative embodiment of the calibration procedure, which advantageously uses a low-pass filtering of successive difference values CC. Such filtering eliminates glitches or spikes that may remain in the calibration signal S in spite of the band-pass filtering performed in the external calibration source 21.

In step 40 of the procedure of FIG. 4, the captures are initialized as in step 30 of FIG. 3, and the variables i and MCC used in the low-pass filtering are also initialized to 0. A loop is then performed to compute an average of a predetermined number K of difference values CC falling within a capture range. The number K is for instance K=8.

Each iteration in this loop begins with steps 31–34 identical to those of FIG. 3. In the first iteration (i=0 in test 45), a capture range is determined in step 46 for filtering out possible glitches of signal S in the following iterations. The capture range is for example determined as being ±10% of the first calculated difference value CC. In the following iterations (i>0 in test 45), the difference value CC obtained in step 33 is examined to determine whether it falls within the capture range (test 47). If the current CC value is out of the capture range, the procedure is reinitialized in step 40. Otherwise, the value CC is added to the accumulation variable MCC, and the loop index i is incremented in step 48. If i<K in the following test 49, the procedure returns to step 41 for the next iteration in the loop. When i=K, the procedure ends in step 50 by computing the calibration ratio as the average difference value MCC/K divided by the reference value $CC_{REF}$.

It will be appreciated that other kinds low-pass filtering procedure could be used.

The peripheral parameters handled by the programs stored in memory 13 and that may be corrected by the software based on the calibration ratio CR can be of various types. A common feature is that such parameter controls the timing of a process without accepting the substantial variations that may be due to the inaccuracy in the RC oscillator frequency.

Figure 5:
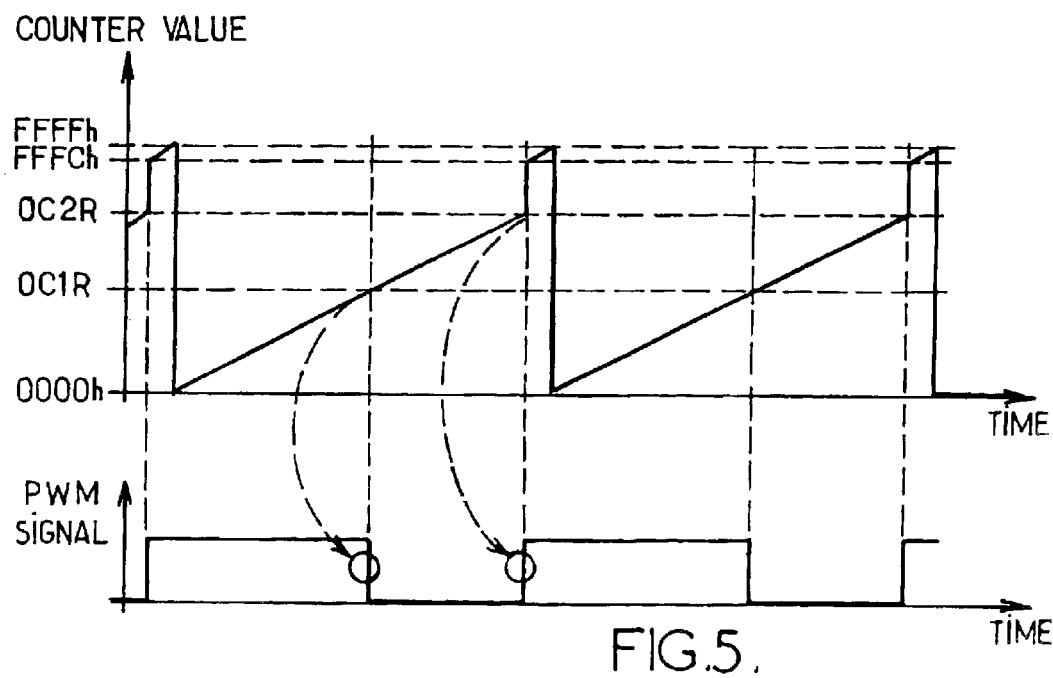
FIG. 5 is a timing diagram illustrating an application of the invention to the timing adjustment of a PWM output of the microcontroller.

In the example illustrated by FIG. 5, the corrected parameters control the frequency and duty ratio of a pulse width modulated (PWM) signal.

As shown in FIG. 1, such PWM signal may be generated by means of the 16-bit timer unit 18 having a pulse width modulator mode of operation. In the illustrated embodiment, this timer unit is the same as the one used in the calibration phase. However, it can also be another timer unit of the microcontroller 10.

The PWM signal shown in FIG. 5 is produced by comparing the value of the 16-bit free running counter with two thresholds OC1R and OC2R loaded in hexadecimal form by the PWM control program into two registers of the timer unit 18. The frequency of the PWM signal is controlled by the OC2R parameter: when the counter value reaches OC2R, a first comparator causes a jump of the counter value to its overflow value 0xFFFC and a rising edge of the PWM signal. The duty ratio of the PWM signal is controlled by the OC1R parameter: when the counter value reached OC1R, another comparator causes a falling edge of the PWM signal. With such PWM modulator design, the parameter OCiR (i=1 or 2) loaded by the program is given by:

$$OCiR = \left(\frac{t_i \times F_{CPU} \times CR}{PRESC} - 5\right)$$

where:
- $t_1$ is the pulse duration (in seconds);
- $t_2$ is the pulse period (in seconds), $t_1/t_2$ being the duty ratio;
- PRESC is a pre-scaler factor calculated as if the CPU 12 had the target clock frequency of, e.g., 2 MHz. It is seen that the calibration ratio CR compensates for the variation of $F_{CPU}$ with respect to that target value.

In another embodiment, the calibration ratio CR is used by an application program stored in memory 13 to adjust the baud rate of the SCI unit 19. The baud rate is usually proportional to the CPU frequency, which can also be adjusted by taking account of the estimated calibration ratio CR.

The present invention is not limited to the examples described above. Many alternative embodiments are possible without departing from the scope defined by the appended claims. For example, it should be obvious to those of ordinary skill in the art in view of the present discussion that alternative embodiments of the new and novel method and microcontroller chip circuit may be implemented in an integrated circuit comprising a circuit supporting substrate that supports at least a portion of the new and novel circuit discussed above. Additionally, the new and novel method and circuit may be implemented in a computer system comprising at least one microcontroller chip circuit thereby providing the advantages of the present invention to such computer system.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of operating a microcontroller chip having a central processing unit, memory means for storing programs and data, at least one peripheral unit for interacting with the outside of the chip, and an internal RC oscillator for providing clock signals to the central processing and peripheral units, wherein the at least one peripheral unit comprises a timer unit having a counter incremented at a frequency proportional to an oscillation frequency of the RC oscillator, the method comprising the steps of:

connecting an external calibration source to a capture input of the timer unit, the calibration source providing a calibration signal having a predefined reference frequency;

sampling a value of the counter on active edges of the calibration signal;

processing the sampled values of the counter to derive a calibration ratio; and performing software correction of at least one parameter handled by a program stored in the memory means based on the calibration ratio to compensate for frequency variations of the RC oscillator.

2. A method according to claim 1, wherein the step of sampling comprises sampling the counter value on at least two consecutive active edges of the calibration signal, and the step of processing comprises determining a difference value between the two sampled values by taking account of any counter overflow occurring between the two consecutive active edges.

3. A method according to claim 2, wherein the step of processing further comprises computing the calibration ratio as the ratio between the determined difference value and a reference value inversely proportional to the reference frequency.

4. A method according to claim 2, wherein the step of processing further comprises low-pass filtering a plurality of difference values successively determined, and computing the calibration ratio as the ratio between the low-pass filtered difference value and a reference value inversely proportional to the reference frequency.

5. A method according to claim 4, wherein the low-pass filtering comprises computing an average of a predetermined number of difference values falling within a capture range.

6. A method according to claim 1, wherein the predefined reference frequency is an A.C. mains frequency.

7. A method according to claim 1, wherein the at least one peripheral unit comprises a pulse width modulator unit, and wherein the step of performing software correction comprises adjusting a frequency and/or a duty ratio of an output signal of the pulse width modulator unit as a function of the calibration ratio.

8. A method according to claim 1, wherein the at least one peripheral unit comprises a serial communication interface unit for communicating with an external circuit, and wherein the step of performing software correction comprises adjusting a baud rate of the serial communication interface unit as a function of the calibration ratio.

9. A microcontroller chip, comprising:

a central processing unit;

memory means for storing programs and data;

at least one peripheral unit for interacting with the outside of the chip, including a timer unit having a counter incremented at a frequency proportional to an oscillation frequency of the RC oscillator;

an internal RC oscillator for providing clock signals to the central processing and peripheral units; and means for sampling a value of the counter on active edges of a calibration signal having a predefined reference frequency, supplied at a capture input of the timer unit by an external calibration source, and wherein the stored programs include instructions for processing the sampled values of the counter to derive a calibration ratio, and instructions for performing software correction of at least one parameter based on the calibration ratio to compensate for frequency variations of the RC oscillator.

10. A microcontroller chip according to claim 9, wherein the sampling means being arranged to sample the counter value on at least two consecutive active edges of the calibration signal, and the processing instructions comprise instructions for determining a difference value between the two sampled values by taking account of any counter overflow occurring between the two consecutive active edges.

11. A microcontroller chip according to claim 10, wherein the processing instructions further comprise instructions for computing the calibration ratio as the ratio between the determined difference value and a reference value inversely proportional to the reference frequency.

12. A microcontroller chip according to claim 10, wherein the processing instructions further comprise instructions for low-pass filtering a plurality of difference values successively determined, and for computing the calibration ratio as the ratio between the low-pass filtered difference value and a reference value inversely proportional to the reference frequency.

13. A microcontroller chip according to claim 12, wherein the instructions for low-pass filtering comprise instructions for computing an average of a predetermined number of difference values falling within a capture range.

14. A microcontroller chip according to claim 9, wherein the at least one peripheral unit comprises a pulse width modulator unit, and wherein the instructions for performing software correction comprise instructions for adjusting a frequency and/or a duty ratio of an output signal of the pulse width modulator unit as a function of the calibration ratio.

15. A microcontroller chip according to claim 9, wherein the at least one peripheral unit comprises a serial communication interface unit for communicating with an external circuit, and wherein the instructions for performing software correction comprise instructions for adjusting a baud rate of the serial communication interface unit as a function of the calibration ratio.

16. A computer system comprising:

memory; and at least one microcontroller, communicatively coupled with the memory, wherein each microcontroller of the at least one microcontroller comprises:

a central processing unit;

memory means for storing programs and data;

at least one peripheral unit for interacting with the outside of the microcontroller, including a timer unit having a counter incremented at a frequency proportional to an oscillation frequency of the RC oscillator;

an internal RC oscillator for providing clock signals to the central processing unit and at least one peripheral unit; and means for sampling a value of the counter on active edges of a calibration signal having a predefined reference frequency, supplied at a capture input of the timer unit by an external calibration source, and wherein the stored programs include instructions for processing the sampled values of the counter to derive a calibration ratio, and instructions for performing software correction of at least one parameter based on the calibration ratio to compensate for frequency variations of the RC oscillator.

17. The microcontroller chip according to claim 9, wherein the predefined reference frequency is an A.C. mains frequency.

18. The computer system according to claim 16, wherein the predefined reference frequency is an A.C. mains frequency.

* * * * *